(12) United States Patent
Hattori et al.

(10) Patent No.: US 9,042,114 B2
(45) Date of Patent: *May 26, 2015

(54) ELECTRONIC COMPONENT

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/147,795

(22) Filed: Jan. 6, 2014

(65) Prior Publication Data

US 2014/0116768 A1 May 1, 2014

Related U.S. Application Data

(63) Continuation of application No. PCT/JP2012/063840, filed on May 30, 2012.

(30) Foreign Application Priority Data

Jul. 11, 2011 (JP) ................................ 2011-152900

(51) Int. Cl.
*H05K 7/00* (2006.01)
*H05K 1/11* (2006.01)
*H05K 1/16* (2006.01)
*H05K 1/18* (2006.01)
*H01G 2/06* (2006.01)
*H05K 3/34* (2006.01)
*H01G 4/228* (2006.01)

(52) U.S. Cl.
CPC ............... *H05K 1/181* (2013.01); *H01G 2/065* (2013.01); *H05K 3/3442* (2013.01); *H05K 2201/049* (2013.01); *H05K 2201/09181* (2013.01); *H05K 2201/10636* (2013.01); *H01G 4/228* (2013.01)

(58) Field of Classification Search
CPC ....... H01G 2/065; H01G 2/06; H05K 3/3442; H05K 2201/049; H05K 1/181; H05K 2201/10636; H05K 1/141; H05K 2201/09181
USPC ........... 361/760, 767, 768, 782; 174/262–266
See application file for complete search history.

(56) References Cited

U.S. PATENT DOCUMENTS

2003/0117784 A1* 6/2003 Fukunabe et al. ............ 361/760
2004/0066589 A1* 4/2004 Togashi et al. ................. 361/15
2011/0127680 A1  6/2011 Masuda et al.

FOREIGN PATENT DOCUMENTS

JP  7-212004 A  8/1995
JP  8-55752 A  2/1996

(Continued)

OTHER PUBLICATIONS

Official Communication issued in International Patent Application No. PCT/JP2012/063840, mailed on Sep. 4, 2012.

*Primary Examiner* — Hoa C Nguyen
(74) *Attorney, Agent, or Firm* — Keating & Bennett, LLP

(57) ABSTRACT

An electronic component includes an interposer, and a multilayer ceramic capacitor. The interposer includes a substrate including front and back surfaces that are parallel or substantially parallel to each other. Two first mounting electrodes and two second mounting electrodes are located on the front surface of the substrate, on opposite end portions in the longitudinal direction. Recesses are located in the longitudinal side surface of the insulating substrate. Connecting conductors are each provided in the side wall surface of each of the recesses. The connecting conductors connect a first external connection electrode and a second external connection electrode that are located on the back surface of the substrate, and first mounting electrodes and second mounting electrodes.

18 Claims, 4 Drawing Sheets

(56) References Cited

FOREIGN PATENT DOCUMENTS

| JP | 8-222831 | A | 8/1996 |
| JP | 2001-168488 | A | 6/2001 |
| JP | 2004-134430 | A | 4/2004 |
| JP | 2004-335657 | A | 11/2004 |
| WO | 2009/028463 | A1 | 3/2009 |

* cited by examiner

ELECTRONIC COMPONENT

BACKGROUND OF THE INVENTION

1. Field of the Invention

The present invention relates to an electronic component including a multilayer ceramic capacitor, and an interposer used when mounting the multilayer ceramic capacitor onto a circuit board.

2. Description of the Related Art

Currently, chip components, in particular, miniature multilayer ceramic capacitors are frequently used for mobile terminals such as cellular phones. A multilayer ceramic capacitor includes a rectangular component body that functions as a capacitor, and outer electrodes formed at opposite ends of the component body.

In related art, generally, as disclosed in Japanese Unexamined Patent Application Publication No. 8-55752, a multilayer ceramic capacitor is electrically and physically connected to a circuit board by placing outer electrodes directly on the mounting land of the circuit board of a mobile terminal, and bonding the mounting land and the outer electrodes together with a bonding agent such as a solder.

However, a multilayer ceramic capacitor is subject to mechanical distortion in some cases due to variations in the voltage applied to the multilayer ceramic capacitor. When this distortion occurs, the distortion is transmitted to the circuit board, causing the circuit board to vibrate. When the circuit board vibrates, vibration sound audible to the human ears occurs in some cases.

As a solution to this problem, for example, Japanese Unexamined Patent Application Publication No. 2004-134430 describes a configuration in which the multilayer ceramic capacitor is not directly mounted on the mounting land. In Japanese Unexamined Patent Application Publication No. 2004-134430, an interposer formed by an insulating substrate is used. In a case where an interposer is used, the multilayer ceramic capacitor is bonded to upper electrodes of the interposer, and lower electrodes of the interposer are bonded to mounting electrodes of the circuit board. The electrical continuity between each of the upper and lower electrodes is provided by a via-hole that penetrates the interposer.

However, Japanese Unexamined Patent Application Publication No. 2004-134430 adopts a special structure in which the arrangement direction of the lower electrodes and the arrangement direction of the upper electrodes in the interposer cross each other, that is, the arrangement direction of the outer electrodes of the multilayer ceramic capacitor and the arrangement direction of the mounting electrodes with respect to the circuit board of the interposer cross each other. Therefore, in a case where the multilayer ceramic capacitor is directly mounted onto the circuit board and vibration sound occurs, when an interposer is used as in Japanese Unexamined Patent Application Publication No. 2004-134430, changes to the land pattern or the like are required. However, such changes to the land pattern are difficult to achieve for circuit boards currently used which typically require high-density mounting. Accordingly, an unmet need is to allow easier structural design and mounting.

SUMMARY OF THE INVENTION

Accordingly, preferred embodiments of the present invention provide an electronic component that allows easy structural design and mounting, and has a mounting strength and electrical characteristics equivalent to those of mounting structures of the related art.

An electronic component according to a preferred embodiment of the present invention includes a substrate that includes front and back surfaces that are parallel or substantially parallel to each other, and four side surfaces that are perpendicular or substantially perpendicular to the front and back surfaces, a first front surface electrode that is located near one side surface of the substrate, the first front surface electrode being provided on the front surface of the substrate, a second front surface electrode that is located near a side surface parallel or substantially parallel to the one side surface of the substrate, the second front surface electrode being provided near the side surface parallel or substantially parallel to the one side surface on the front surface of the substrate, a first back surface electrode that is provided on a back surface of the substrate, opposite to the first front surface electrode, a second back surface electrode that is provided on the back surface of the substrate, opposite to the second front surface electrode, a chip component that preferably has a rectangular or substantially rectangular parallelepiped shape, the chip component being mounted on the front surface, the chip component including a first outer electrode that is connected to the first front surface electrode, and a second outer electrode that is connected to the second front surface electrode, a first groove and a second groove that are located in each of two side surfaces of the substrate that are parallel or substantially parallel to a direction normal to the one side surface, the first and second grooves being at least partially located between the first front surface electrode and the first back surface electrode, the first and second grooves being arranged along a direction normal to the front and back surfaces, a third groove and a fourth groove that are located in each of the two side surfaces of the substrate, the third and fourth grooves being at least partially located between the second front surface electrode and the second back surface electrode, the third and fourth grooves being arranged along the direction normal to the front and back surfaces, and a first connecting conductor that is provided in a wall surface of each of the first, second, third, and fourth grooves, the first connecting conductor connecting the front surface electrode and the back surface electrode According to this configuration, each of the grooves is located in a side surface of the substrate. Therefore, for example, in a case where the electronic component is mounted onto the circuit board with a bonding agent such as a solder, the amount of bonding agent that is allowed to escape to the grooves increases, thus reducing the amount of bonding agent that climbs and wets onto the front surface electrodes. As a result, in a case where the chip component undergoes distortion due to variations in applied voltage, it is possible to reduce adhesion of the bonding agent to a region in which the distortion has occurred.

An electronic component according to a preferred embodiment of the present invention may be configured to include a fifth groove that is located in the side surface perpendicular or substantially perpendicular to the two side surfaces, the fifth groove being at least partially located between the first front surface electrode and the first back surface electrode, the fifth groove being arranged along the direction normal to the front and back surfaces, a sixth groove that is located in a side surface parallel or substantially parallel to the side surface in which the fifth groove is located, the sixth groove being at least partially located between the second front surface electrode and the second back surface electrode, the sixth groove being arranged along the direction normal to the front and back surfaces, and a second connecting conductor that is provided in a wall surface of each of the fifth and sixth grooves, the second connecting conductor connecting the front surface electrode and the back surface electrode.

In this case, as opposed to a case where four grooves are provided, the amount of bonding agent that climbs and wets onto the front surface electrodes is further reduced. As a result, in a case where the chip component undergoes distortion due to variations in applied voltage, it is possible to reduce adhesion of the bonding agent to a region in which the distortion has occurred so as to reduce or prevent connection failures.

An electronic component according to a preferred embodiment of the present invention may be configured so that each of the first front surface electrode and the second front surface electrode is divided into two electrodes, and the two flat electrodes are provided on the front surface so as to be spaced apart from each other along a direction normal to the two side surfaces.

According to this configuration, each of the front surface electrodes includes two flat electrodes, and the two flat electrodes are provided on the front surface of the substrate so as to be spaced apart from each other. For example, in a case where the chip component is a multilayer ceramic capacitor including inner electrodes that are perpendicular or substantially perpendicular to the front surface of the substrate, by providing a space between the two flat electrodes, when the inner electrodes undergo changes due to applied voltage, the portion that undergoes large changes is located between the two flat electrodes so as to prevent the portion that has undergone changes from coming into contact with the flat electrodes.

An electronic component according to a preferred embodiment of the present invention is preferably configured so that the chip component is a multilayer ceramic capacitor, the multilayer ceramic capacitor including a ceramic laminate, and the first and second outer electrodes provided to the ceramic laminate, the ceramic laminate being formed by alternately laminating a plurality of ceramic layers and a plurality of inner electrodes, and the multilayer ceramic capacitor is mounted so that the front surface of the substrate and the inner electrodes are parallel or substantially parallel to each other.

According to this configuration, by controlling the direction in which to mount the multilayer ceramic capacitor, it is possible to reduce adhesion of a bonding agent made of a solder or the like to a region of the chip component which is subject to large distortion due to variations in applied voltage. Moreover, a flat substrate is preferably used, and the multilayer ceramic capacitor is mounted on the substrate. Therefore, structural design and mounting are easy, and a mounting strength and electrical characteristics equivalent to those of mounting structures commonly used in related art is achieved.

When the multilayer ceramic capacitor is mounted onto the circuit board by using the electronic component according to one of the preferred embodiments of the present invention, a defect in the bond created by the bonding agent at the time of mounting is significantly reduced or prevented. In addition, the electronic component has a simple structure and allows miniaturization, and allows easy mounting onto the circuit board. Furthermore, it is possible to ensure a mounting strength and electrical characteristics equivalent to those of mounting structures commonly used in related art.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
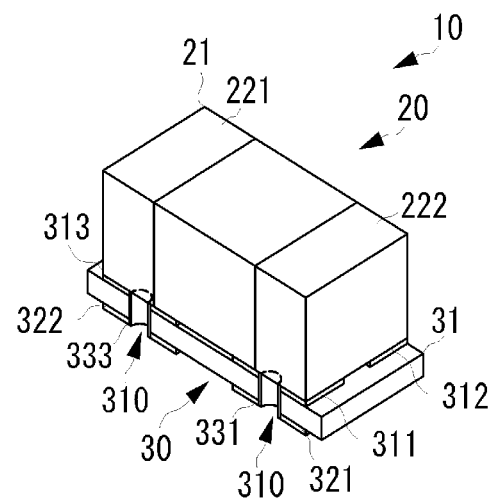
FIGS. 1A and 1B are perspective views respectively illustrating the outward appearance and mounting state of an electronic component according to a preferred embodiment of the present invention.
Figure 1B:
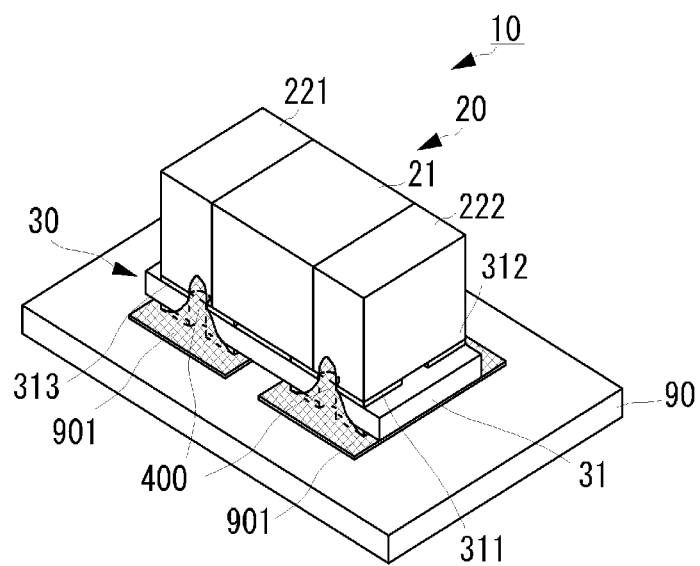
Figure 2A:
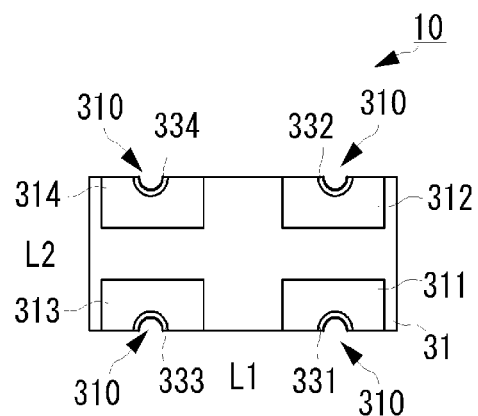
FIGS. 2A-2D are four-side views of the electronic component according to a preferred embodiment of the present invention.
Figure 2C:
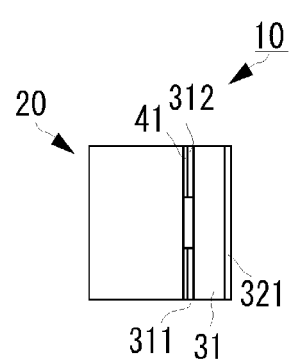
Figure 2B:
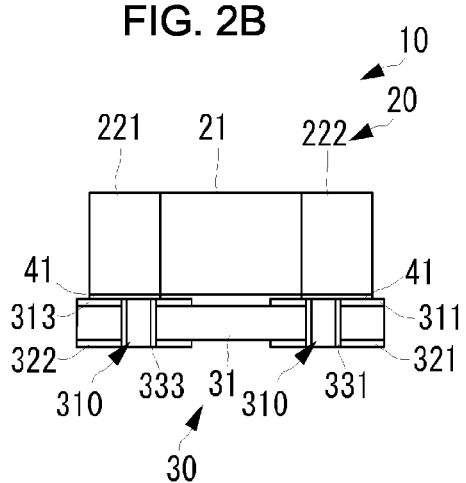
Figure 2D:
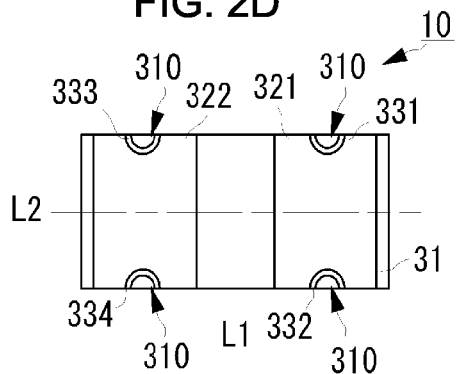
Figure 3A:
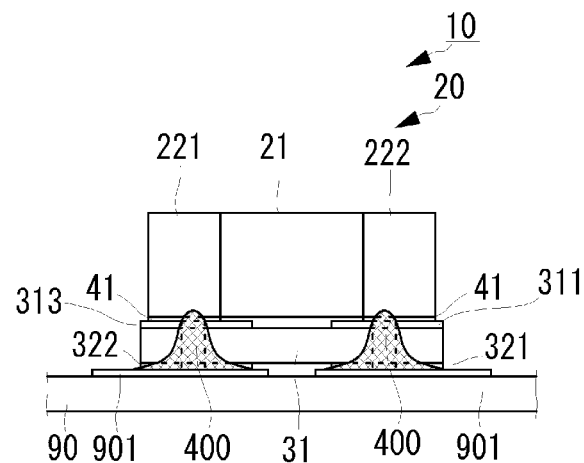
FIGS. 3A and 3B are a first side view and a second side view each illustrating the mounting state of the electronic component according to a preferred embodiment of the present invention.
Figure 3B:
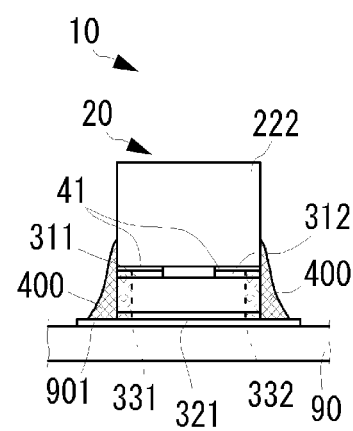

An electronic component according to a preferred embodiment of the present invention will be described with reference to the drawings. FIG. 1A is a perspective view of the outward appearance of an electronic component 10 according to a preferred embodiment of the present invention. FIG. 1B is a perspective view of the mounting state of the electronic component 10. FIGS. 2A-2D are four-side views of the electronic component 10 according to the present preferred embodiment, of which FIG. 2A is a plan view, FIG. 2B is a first (longitudinal) side view, FIG. 2C is a second (lateral) side view, and FIG. 2D is a rear view. FIGS. 3A and 3B are a first side view and a second side view each illustrating the mounting state of the electronic component 10 according to the present preferred embodiment.

The electronic component 10 includes a multilayer ceramic capacitor (chip component) 20 and an interposer 30. In FIG. 2A, the multilayer ceramic capacitor 20 that is mounted on the substrate 31 is not illustrated.

The multilayer ceramic capacitor 20 includes a ceramic laminate 21 preferably having a rectangular or substantially rectangular parallelepiped shape, for example. The ceramic laminate 21 has a predetermined number of flat inner electrodes (not illustrated) that are laminated with dielectric layers therebetween. A first outer electrode 221 and a second outer electrode 222 are provided at opposite ends in the longitudinal direction of the ceramic laminate 21.

The first outer electrode 221 and the second outer electrode 222 are provided not only on opposite end surfaces in the longitudinal direction but extend over from the opposite end surfaces in the longitudinal direction to opposite end surfaces in the lateral direction (direction perpendicular or substantially perpendicular to the longitudinal direction), the top surface, and the bottom surface. By taking corrosion resistance and electrical conductivity into consideration, predetermined metal plating is applied to the first outer electrode 221 and the second outer electrode 222.

The multilayer ceramic capacitor 20 with such a structure preferably has a length (longitudinal direction) by width (lateral direction) dimension of approximately, for example, 3.2 mm×1.6 mm, 2.0 mm×1.25 mm, 1.6 mm×0.8 mm, 1.0 mm×0.5 mm, or 0.6 mm×0.3 mm.

The interposer 30 includes the substrate 31. The substrate 31 is preferably made of insulating resin with a thickness of about 0.5 mm to about 1.0 mm, for example. When viewed in a direction (direction of a normal) perpendicular or substantially perpendicular to the front surface and the back surface that are flat surfaces, the substrate 31 preferably has a rectangular or substantially rectangular shape similar to the multilayer ceramic capacitor 20, for example.

When viewed in the direction of the normal, the substrate 31 is preferably larger than the multilayer ceramic capacitor 20 in the longitudinal direction. For example, the substrate 31 has a size that extends off the length of the multilayer ceramic capacitor 20 by a predetermined ratio. The substrate 31 may have the same length in the longitudinal direction as that of the multilayer ceramic capacitor 20.

Hereinafter, as illustrated in FIGS. 2A and 2D, a line that passes through the center in the longitudinal direction of the substrate 31 and extends along the lateral direction will be referred to as centerline L1, and a line that passes through the center in the lateral direction and extends along the longitudinal direction will be referred to as centerline L2.

Two first mounting electrodes (first front surface electrodes) 311 and 312 and two second mounting electrodes (second front surface electrodes) 313 and 314 are formed on the front surface of the substrate 31, near opposite end portions in the longitudinal direction. As illustrated in FIG. 2A, each of the first mounting electrodes 311 and 312 is a flat electrode having a surface defined by long and short sides. The long side of each of the first mounting electrodes 311 and 312 coincides with the longitudinal direction of the substrate 31, and a portion of the long side is flush with the side surface (hereinafter, referred to as longitudinal side surface) of the substrate 31 along the longitudinal direction. As a result, the first mounting electrodes 311 and 312 are in line symmetry with respect to the centerline L2. While in FIG. 2A, the short side of the first mounting electrodes 311 and 312 is spaced apart by a predetermined distance from the side surface perpendicular or substantially perpendicular to the longitudinal direction of the substrate 31 (hereinafter, referred to as lateral side surface), the short side of the first mounting electrodes 311 and 312 may be flush with the lateral side surface of the insulating substrate 31.

Each of the second mounting electrodes 313 and 314 is a flat electrode including a surface defined by long and short sides. The second mounting electrodes 313 and 314 are arranged in the same manner as the first mounting electrodes 311 and 312, and are in line symmetry with the first mounting electrodes 311 and 312 with respect to the centerline L1.

The shapes of the first mounting electrodes 311 and 312 and second mounting electrodes 313 and 314 may be set as appropriate in accordance with the shape of the outer electrodes of the multilayer ceramic capacitor 20. In this way, a so-called self-alignment effect is obtained when mounting the multilayer ceramic capacitor 20 onto the interposer 30, allowing the multilayer ceramic capacitor 20 to be mounted at a desired position on the interposer 30. This self-alignment effect prevents climbing up and wetting of solder from an external circuit board 90 more reliably.

A first external connection electrode (first back surface electrode) 321 and a second external connection electrode (second back surface electrode) 322 are located on the back surface of the substrate 31. Each of the first external connection electrode 321 and the second external connection electrode 322 is arranged so as to extend to the position of a predetermined length from a position near the end portion in the longitudinal direction toward the center of the longitudinal direction, and is arranged to extend over the entire length in the lateral direction. In addition, the first external connection electrode 321 and the second external connection electrode 322 are located opposite to the first mounting electrode 311 and the second mounting electrode 312, respectively. The shape of the first external connection electrode 321 and the second external connection electrode 322 may be set as appropriate in accordance with the shape of a mounting land 901 of the external circuit board 90 on which the electronic component 10 is mounted.

Four recesses (grooves) 310, which are located on the longitudinal side surface side of the substrate 31, are provided in each of the substrate 31, the first mounting electrodes 311 and 312, the second mounting electrodes 313 and 314, and the first and second external connection electrodes 321 and 322. The recesses 310 penetrate the insulating substrate 31 in the thickness direction so as to define a circular or substantially circular arc with a predetermined diameter when viewed in the direction of the normal. When viewed in the direction of the normal, the four recesses 310 are located at positions that are in line symmetry with respect to each of the centerlines L1 and L2.

More specifically, the recesses 310 are located under the bottom surface of each of the first and second outer electrodes 221 and 222 of the multilayer ceramic capacitor 20. The recesses 310 have such a shape that the intermediate portion of their circular arc extends into the space under the bottom surface of each of the first outer electrode 221 and the second outer electrode 222. In other words, when viewed in the direction of the normal, the recesses 310 are arranged such that the intermediate portion of their circular arc overlaps the multilayer ceramic capacitor 20. In still other words, the multilayer ceramic capacitor 20 is mounted such that each of the first outer electrode 221 and the second outer electrode 222 at the opposite ends overlaps the intermediate portions of the recesses 310.

Connecting conductors 331, 332, 333, and 334 are located in the recesses 310. The connecting conductor 331 provides electrical continuity between the first mounting electrode 311 and the first external connection electrode 321, and the connecting conductor 332 provides electrical continuity between the first mounting electrode 312 and the first external connection electrode 321. The connecting conductor 333 provides electrical continuity between the second mounting electrode 313 and the second external connection electrode 322, and the connecting conductor 334 provides electrical continuity between the second mounting electrode 314 and the second external connection electrode 322.

The multilayer ceramic capacitor 20 may be mounted onto the interposer 30 having the above-mentioned structure such that the flat surfaces of the inner electrodes are parallel or substantially parallel to the front and back surfaces of the interposer 30 or are perpendicular or substantially perpendicular to the front and back surfaces of the interposer 30.

The first outer electrode 221 of the multilayer ceramic capacitor 20 is mounted on the first mounting electrode 311 and the first mounting electrode 312 that are located on the interposer 30. The second outer electrode 222 is mounted on the second mounting electrode 313 and the second mounting electrode 314 that are located on the interposer 30. At this time, bonding of the electrodes is accomplished by re-melting of the metal plating (for example, tin plating) of the first outer electrode 221 and the second outer electrode 222, on the mounting surface side of the first outer electrode 221 and the second outer electrode 222. Consequently, a bonding layer 41 is provided between the first outer electrode 221 and each of the first mounting electrode 311 and the first mounting electrode 312, and between the second outer electrode 222 and each of the second mounting electrode 313 and the second mounting electrode 314 so as to establish electrical and mechanical connection.

If metal plating similar to that applied to the outer electrodes is applied to the first mounting electrode 311 and the first mounting electrode 312 in advance, the above-mentioned connection is established together with the metal plating on the first mounting electrode 311 and the first mounting electrode 312. In addition, if metal plating similar to that applied to the outer electrodes is applied to the second mounting electrode 313 and the second mounting electrode 314 in advance, the above-mentioned connection is established together with the metal plating on the second mounting electrode 313 and the second mounting electrode 314.

The bonding of the multilayer ceramic capacitor 20 and the interposer 30 may be performed by a bonding agent (for example, a solder), without using the metal plating on the first and second outer electrodes 221 and 222 or the metal plating on the interposer 30.

The electronic component 10 having such a structure is mounted onto the external circuit board 90 as illustrated in FIGS. 1B, 3A and 3B. At this time, the electronic component 10 is mounted in such a way that each of the first external connection electrode 321 and the second external connection electrode 322 connects to the corresponding mounting land 901 of the external circuit board 90. A bonding agent (for example, a solder) 400 is preferably used for the connection between each of the first external connection electrode 321 and the second external connection electrode 322 and the corresponding mounting land 901.

This bonding using the bonding agent 400 is performed in such a way that a fillet is provided at least in an area extending from the mounting land 901 of the external circuit board 90 to each of the connecting conductors 331, 332, 333, and 334 in the corresponding recesses 310 of the interposer 30. Forming a fillet in this way prevents lifting of the electronic component 10 at the time of mounting, ensures bond strength, and enables a visual check for bond failures, and thus proves very advantageous. Although a solder is preferred as the bonding agent 400, any material other than a solder may be used as a bonding agent as long as the material has appropriate wettability and electrical conductivity.

Performing bonding by using the bonding agent 400 in this way presents the following problem. That is, in a case where a large amount of bonding agent is supplied, it is conceivable that excess bonding agent 400, more than necessary to form a fillet at the connecting conductors 331, 332, 333, and 334 in the recesses 310, climbs onto the first and second outer electrodes 221 and 222 of the multilayer ceramic capacitor 20 from the upper surface side of the interposer 30 via the connecting conductors 331, 332, 333, and 334.

However, according to this preferred embodiment, the recesses 310 are provided in the longitudinal side surface of the interposer 30. Therefore, even when the bonding agent 400 climbs and wets onto the first and second outer electrodes 221 and 222 of the multilayer ceramic capacitor 20, the bonding agent 400 reaches the side surfaces of the first and second outer electrodes 221 and 222. In this regard, the multilayer ceramic capacitor 20 is subject to distortion due to applied voltage. At this time, the distortion is greater in the central region in the longitudinal direction of the multilayer ceramic capacitor 20. Accordingly, by providing the recesses 310 as described above, it is possible to reduce adhesion of the bonding agent 400 made of a solder or the like to a region of the multilayer ceramic capacitor 20 which is subject to large distortion due to variations in applied voltage.

By providing the recesses 310 in the longitudinal side surface of the substrate 31, the bonding agent 400 is applied to the longitudinal side surface of the substrate 31, and is not applied to the lateral side surface. Therefore, no space to apply the bonding agent 400 is required for the longitudinal direction of the insulating substrate 31 in the external circuit board 90 so as to prevent the multilayer ceramic capacitor 20 from being placed in a large area in the longitudinal direction of the substrate 31.

Further, the recesses 310 that extend into the space under the bottom surface of the multilayer ceramic capacitor 20 are provided, and the connecting conductors 331, 332, 333, and 334 are provided only in the recesses 310. Accordingly, as the bonding agent 400 climbs and wets onto the principal surface of the interposer 30, the bonding agent 400 goes through the bottom surface of the multilayer ceramic capacitor 20. Therefore, the amount of the bonding agent 400 that climbs and wets onto the principal surfaces of the first and second outer electrodes 221 and 222 is reduced, and the amount of the bonding agent 400 that climbs and wets onto a region of the multilayer ceramic capacitor 20 which undergoes large distortion is further reduced.

Therefore, by using the configuration according to this preferred embodiment, supposing that the amount of the bonding agent 400 is just a sufficient amount to directly mount the multilayer ceramic capacitor 20 onto the mounting land 901 of the external circuit board 90, even at maximum, the amount of the bonding agent 400 that climbs up and wets from the mounting surface of the principal surface of each of the first and second outer electrodes 221 and 222 of the multilayer ceramic capacitor 20 is limited.

A predetermined distance is provided between the first mounting electrodes 311 and 312, and between the second mounting electrodes 313 and 314. In a case where the inner electrodes of the multilayer ceramic capacitor 20 are mounted perpendicularly or substantially perpendicularly to the front surface, when voltage is applied to the multilayer ceramic capacitor 20, distortion occurs at a position located in either end portion in the longitudinal direction of the multilayer ceramic capacitor 20, and in a substantially central portion of the lateral direction (laminating direction of the inner electrodes). At this time, because this central portion is located between the first mounting electrodes 311 and 312, and between the second mounting electrodes 313 and 314, it is possible to prevent vibration (creaking noise) that occurs when the multilayer ceramic capacitor 20 undergoes distortion from being transmitted to the interposer 30 via the first mounting electrode 311 and the like.

The specific configuration and the like of the electronic component 10 can be designed and modified as appropriate, and the operation and effects described with reference to the above-mentioned preferred embodiment is merely illustrative of the most preferred operation and effects that arise from the present invention. It is to be understood that the operation and effects according to the present invention are not limited to those described above with reference to the above-mentioned preferred embodiment.

For example, while the four recesses 310 are preferably located in positions that are in line symmetry with respect to each of the centerlines L1 and L2, the positions of the four recesses 310 are not limited to these positions.

Figure 4:
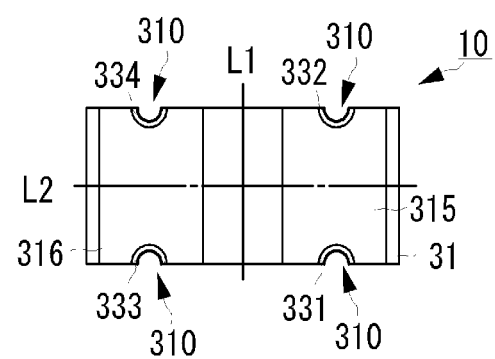
FIG. 4 illustrates another example of an electronic component.
Figure 5:
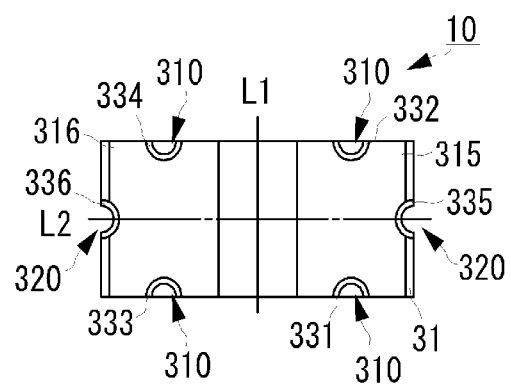
FIG. 5 illustrates another example of an electronic component.

The configuration of the first mounting electrode 311 and the like and the positions where the recesses are located are not limited to those of the above-mentioned preferred embodiment. FIGS. 4 and 5 each illustrate another example of an electronic component. FIGS. 4 and 5 are plan views of an electronic component, and correspond to FIG. 2A.

In FIG. 4, the first mounting electrodes 311 and 312 illustrated in FIG. 2A are preferably defined by a single electrode 315, and the second mounting electrodes 313 and 314 are preferably defined by a single electrode 316, for example. In a case where the inner electrodes of the multilayer ceramic capacitor 20 are mounted perpendicularly or substantially perpendicularly to the front surface, providing a space between the first mounting electrodes 311 and 312, and between the second mounting electrodes 313 and 314 is an effective anti-vibration measure. In a case where the inner electrodes of the multilayer ceramic capacitor 20 are mounted parallel or substantially parallel to the front surface, the same measure proves less effective in comparison to the case where the inner electrodes are mounted perpendicularly or substantially perpendicularly. In this case, the configuration illustrated in FIG. 4 may be adopted to allow for easy manufacturing process.

As opposed to the configuration illustrated in FIG. 4, recesses (fifth and sixth grooves) 320 may be further provided in two side surfaces extending along the lateral direction of the substrate 31 as illustrated in FIG. 5. Like the recesses 310, when viewed in the direction of the normal, the recesses 320 are located at positions that are in line symmetry with respect to the centerline L1, and lie on the centerline L2. Connecting conductors 335 and 336 are located in the respective inner walls of the recesses 310. The connecting conductor 335 provides electrical continuity between the first mounting electrode 311 and the first external connection electrode 321, and the connecting conductor 336 provides electrical continuity between the first mounting electrode 312 and the first external connection electrode 321. By further providing the recesses 320, as compared with the case where only the four recesses 310 are provided, it is possible to further reduce climbing up and wetting of solder, and prevent vibration of the multilayer ceramic capacitor 20 applied with voltage from being transmitted to the interposer 30.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a substrate including:
      front and back surfaces that are parallel or substantially parallel to each other; and
      four side surfaces that are perpendicular or substantially perpendicular to the front and back surfaces;
   a first front surface electrode that is located adjacent to one of the side surface of the substrate, the first front surface electrode being provided on the front surface of the substrate;
   a second front surface electrode that is located adjacent to a side surface parallel or substantially parallel to the one of the side surfaces of the substrate, the second front surface electrode being provided adjacent one of the side surfaces that is parallel or substantially parallel to the one side surface on the front surface of the substrate;
   a first back surface electrode that is provided on a back surface of the substrate, opposite to the first front surface electrode;
   a second back surface electrode that is provided on the back surface of the substrate, opposite to the second front surface electrode;
   a chip component mounted on the front surface and including:
      a first outer electrode that is connected to the first front surface electrode; and
      a second outer electrode that is connected to the second front surface electrode;
   a first groove and a second groove that are located in each of two of the side surfaces of the substrate that are parallel or substantially parallel to a direction normal to the one side surface, the first and second grooves being at least partially located between the first front surface electrode and the first back surface electrode, the first and second grooves being arranged along a direction normal to the front and back surfaces;
   a third groove and a fourth groove that are located in each of the two side surfaces of the substrate, the third and fourth grooves being at least partially located between the second front surface electrode and the second back surface electrode, the third and fourth grooves being arranged along the direction normal to the front and back surfaces; and
   a first connecting conductor that is provided in a wall surface of each of the first, second, third, and fourth grooves, the first connecting conductor connecting the front surface electrode and the back surface electrode.

2. The electronic component according to claim 1, further comprising:
   a fifth groove that is located in one of the side surfaces that is perpendicular or substantially perpendicular to the two side surfaces, the fifth groove being at least partially located between the first front surface electrode and the first back surface electrode, the fifth groove being arranged along the direction normal to the front and back surfaces;
   a sixth groove that is located in one of the side surfaces that is parallel or substantially parallel to the side surface in which the fifth groove is formed, the sixth groove being at least partially located between the second front surface electrode and the second back surface electrode, the sixth groove being arranged along the direction normal to the front and back surfaces; and
   a second connecting conductor that is provided in a wall surface of each of the fifth and sixth grooves, the second connecting conductor connecting the front surface electrode and the back surface electrode.

3. The electronic component according to claim 1, wherein each of the first front surface electrode and the second front surface electrode is divided into two flat electrodes, and the two flat electrodes are arranged on the front surface so as to be spaced apart from each other along a direction normal to the two side surfaces.

4. The electronic component according to claim 1, wherein the chip component is a multilayer ceramic capacitor including a ceramic laminate;
   the first and second outer electrodes are provided on the ceramic laminate;
   the ceramic laminate includes a plurality of ceramic layers and a plurality of inner electrodes alternately stacked on each other; and
   the multilayer ceramic capacitor is mounted so that the front surface of the substrate and the inner electrodes are parallel or substantially parallel to each other.

5. The electronic component according to claim 1, wherein the chip component has a rectangular or substantially rectangular parallelepiped shape.

6. The electronic component according to claim 1, wherein the electronic component is a multilayer capacitor.

7. The electronic component according to claim 1, wherein the substrate defines an interposer.

8. The electronic component according to claim 1, wherein the substrate has a rectangular or substantially rectangular shape.

9. The electronic component according to claim 1, wherein the substrate is larger than the chip component when viewed in plan.

10. The electronic component according to claim 1, wherein the first, second, third and fourth grooves are defined by recesses.

11. The electronic component according to claim 10, wherein the recesses are located in a longitudinal side surface of the substrate.

12. The electronic component according to claim 10, wherein the recesses are located under bottoms surfaces of the first and second outer electrodes, respectively.

13. The electronic component according to claim 12, wherein the recesses have shapes such that intermediate portions of circular arc portions extend into a space under the bottom surfaces of the first and second outer electrodes.

14. The electronic component according to claim 12, wherein the recesses have shapes such that intermediate portions of circular arc portions overlap the electronic component.

15. The electronic component according to claim 12, wherein the recesses have shapes such that intermediate portions of circular arc portions extend into spaces under the bottom surfaces of the first and second outer electrodes.

16. The electronic component according to claim 12, wherein the first front surface electrode is defined by a single electrode, and the second front surface electrode is defined by a single electrode.

17. The electronic component according to claim 1, wherein the first front surface electrode is a mounting electrode, and the second front surface electrode is a mounting electrode.

18. The electronic component according to claim 1, wherein at least two of the first front surface electrodes are provided, and at least two of the second front surface electrodes are provided.

* * * * *